United States Patent [19]

Igaki et al.

[11] Patent Number: 4,484,077
[45] Date of Patent: Nov. 20, 1984

[54] EXPOSURE SYSTEM AND METHOD USING AN ELECTRON BEAM

[75] Inventors: Seigo Igaki, Inagi; Yoshiro Goto, Yokohama; Yasuo Furukawa, Inagi, all of Japan

[73] Assignee: Fujitsu Limited, Kawasaki, Japan

[21] Appl. No.: 233,599

[22] PCT Filed: Jun. 6, 1980

[86] PCT No.: PCT/JP80/00125
§ 371 Date: Feb. 6, 1981
§ 102(e) Date: Feb. 6, 1981

[87] PCT Pub. No.: WO80/02772
PCT Pub. Date: Dec. 11, 1980

[30] Foreign Application Priority Data

Jun. 8, 1979 [JP] Japan .................................. 72088/79
Jun. 8, 1979 [JP] Japan .................................. 72087/79

[51] Int. Cl.³ ............................................. H01J 37/00
[52] U.S. Cl. ................................. 250/492.2; 250/398
[58] Field of Search ............... 250/492.2, 492.3, 398; 364/490, 491, 518, 521

[56] References Cited

U.S. PATENT DOCUMENTS 4,147,937  3/1979  Buelow et al. ................. 250/492.2
4,245,321  1/1981  Gennetten ........................ 364/521

FOREIGN PATENT DOCUMENTS 54-2565  2/1979  Japan .
595752   3/1978  U.S.S.R. ............................. 364/491

OTHER PUBLICATIONS

Patlach, "Electron-Beam Lithograph Pattern Generating System", J. Vac. Sci. Tech., 15 (3), May/Jun. 1976, pp. 874–877.
Chang, "Electron-Beam Lithograph Draws a Finer Line", Electronics, May 12, 1977, pp. 89–98.
Beasley, "Electron-Beam Pattern Generator", *Philips Tech. Rev.*, 37 (11/12), 1977, pp. 334–346.

*Primary Examiner*—Janice A. Howell
*Assistant Examiner*—Carolyn E. Fields
*Attorney, Agent, or Firm*—Staas & Halsey

[57] ABSTRACT

An exposure system or apparatus and method using an electron beam for forming a pattern on a subject, which uses a figure Q which surrounds a pattern P and which is more simplified than the pattern P. Data related to the positions of the vertical and horizontal electron beam used to expose the pattern are stored in a pattern package memory based upon the surrounding figure. The data related to the positions of the electron beam, data related to the start-points of the surrounding figure, and signals based upon the scanning data are supplied to a deflection device of an electron beam device.

15 Claims, 18 Drawing Figures

EXPOSURE SYSTEM AND METHOD USING AN ELECTRON BEAM

BACKGROUND OF THE INVENTION

The present invention relates to an exposure apparatus or system and method using an electron beam. The exposure of a subject using an electron beam as contemplated by the present invention can be employed for forming patterns in an electronic memory device such as magnetic bubble device by irradiating with the electron beam.

Figure 1:
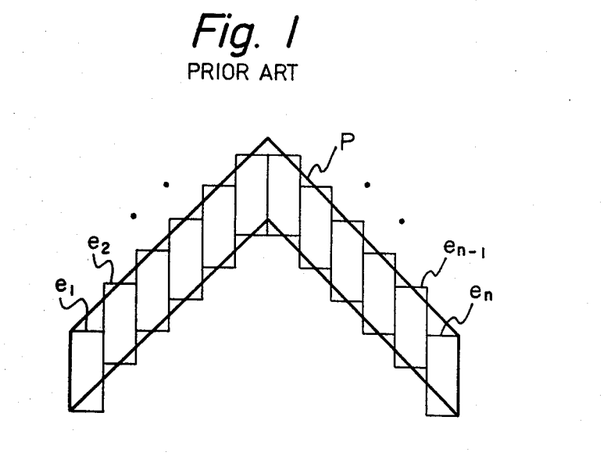
FIGS. 1 and 2 are diagrams illustrating conventional exposure patterns using an electron beam.

In effecting the exposure using the radiation from an electron beam to form a chevron figure in a magnetic bubble memory device, it is accepted practice to approximate the chevron figure P by many rectangular picture elements $e_1, e_2, \ldots, e_n$ as shown in FIG. 1, to store the data for the individual rectangular picture elements in a main memory, and to successively read the data from the main memory to supply generating instructions to a device for irradiating the electron beam. This method requires a digital-to-analog converter for converting the digital data for each of the rectangular picture elements into irradiation instruction signals having analog quantities.

However, since there exist a great number of rectangular picture elements, the above-mentioned conventional method presented a problem with regard an enormous amount of data that must be transferred from the main memory to the device for generating the electron beam responsive to instruction from the central processor. Another problem existed with regard to the difficulty in increasing the operation speed since large settling times were necessary for the digital-to-analog converter. When the magnetic bubble memory device employs: a figure consisting of a chevron set in which a great number of chevron figures of the same pattern are arrayed; as well as a digital-to-analog converter consisting of a digital-to-analog converter for start-point data which determines the starting point for each rectangular picture element for each chevron figure, and a digital-to-analog converter for converting data for scanning each rectangular picture element for each chevron figure, the start-point of the rectangular picture elements for the chevron figures must be determined many times. That is, the digital-to-analog converter needs a longer settling time.

Figure 2:
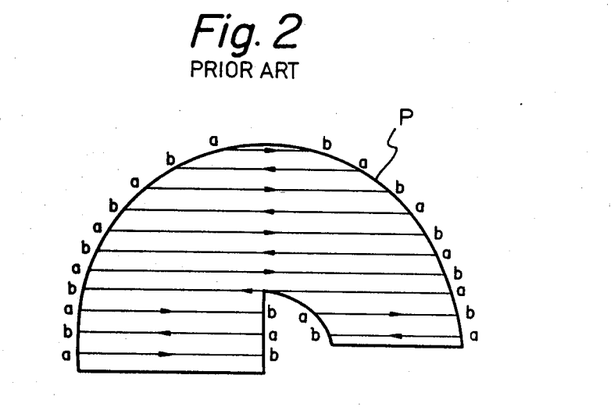

FIG. 2 illustrates another conventional exposure system using an electron beam. According to this method, a desired figure P is successively scanned along horizontal lines, and a start point a and an end point b are specified for each line. Even in this system which has many startpoints, the digital-to-analog converter requires an increased setting time for each of the start-points, and makes it difficult to increase the operation speed. This system has been disclosed, for example, in A. M. Patlach et al: Electron-beam Lithographic Pattern Generation System, J. Vac. Sci. Technol. 15(3), American Vacuum Society, May/June, 1978.

The present invention is proposed to solve the above-mentioned problems inherent in the conventional exposure systems or apparatus and methods using an electron beam.

SUMMARY OF THE INVENTION

In exposing a figure having a particular shape different from a rectangular shape using an electron beam, the present invention has as objects: (1) increasing the operation speed of the exposure when using an electron beam reducing the quantity of data necessary for forming figures; (2) reducing the time necessary for transferring the data; and (3) reducing the settling time of the digital-to-analog converter which is required for setting the start-points.

According to the present invention, there is provided an exposure apparatus or system and method using an electron beam, comprising: surrounding a fundamental pattern such as the a chevron figure by a figure which is more simplified than said fundamental pattern and storing data for positions of the electron beam in a pattern package memory in order to form said fundamental pattern based upon the surrounding figure. The apparatus and method also including storing data related to start-points of the surrounding figure and scanning data in a pattern generation control device and supplying the data related to start-points of the surrounding figure and the scanning data from the pattern generation control device to an electron beam deflection means of an electron beam irradiation device. The device and method additionally includes supplying the data related to the positions of the electron beam stored in the pattern package memory to said electron beam deflection means of said electron beam irradiation device in response to instructions from a central processor, so that a desired pattern is formed by said electron beam irradiation device.

DESCRIPTION OF THE PREFERRED EMBODIMENTS

Figure 3:
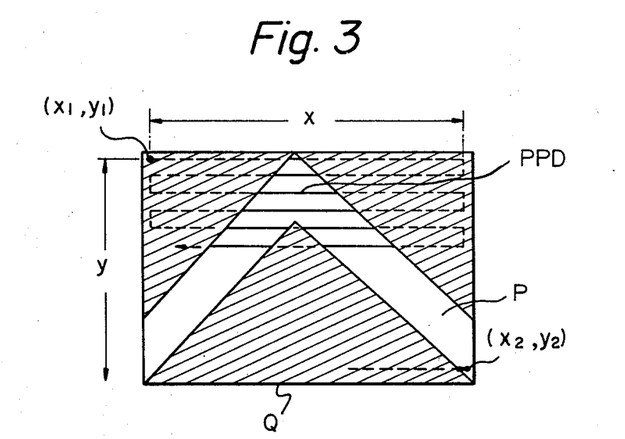
FIGS. 3 and 4 are diagrams illustrating a pattern to which is applied the exposure apparatus and method using an electron beam according to an embodiment of the present invention.
Figure 4:
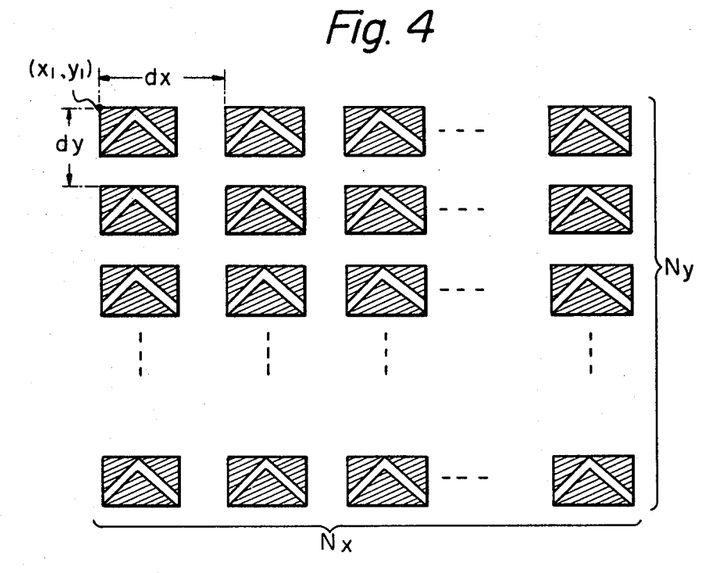
Figure 5:
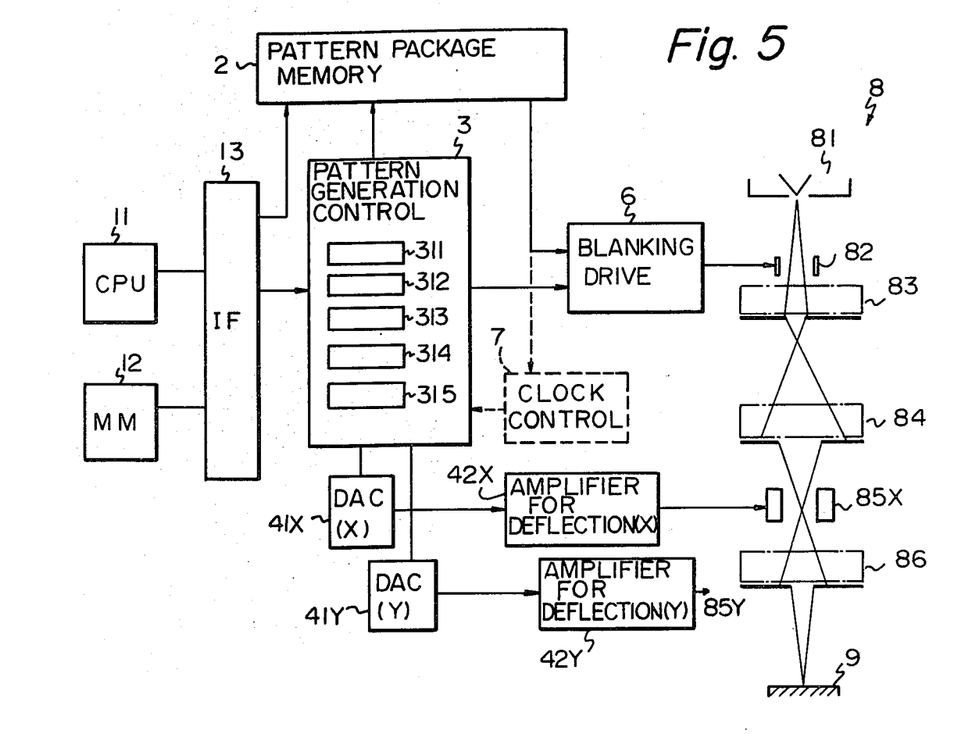
FIG. 5 illustrates a block circuit diagram of a device employed by the exposure system using the electron beam according to the embodiment of the present invention.

FIGS. 3 and 4 illustrate the operation of the exposure system using an electron beam according to an embodiment of the present invention, and FIG. 5 illustrates a device which is employed in the exposure method using the electron beam. In this embodiment, a pattern P having the shape of a chevron figure is exposed. In this case, the pattern P is surrounded by a figure Q which circumscribes the pattern P and which is more simplified than the pattern P. The pattern P corresponds to the positive image of the combined fundamental pattern P and simplified surrounding figure Q, while the hatched area of the surrounding figure Q corresponds to the negative image of the combined fundamental pattern P and simplified surrounding figure Q. In FIG. 3, a rectangle is selected as a surrounding figure. To scan the whole region of the surrounding figure Q, the electron beam performs scanning along a scanning path which starts from a point $(x_1, y_1)$ at the upper left corner and which ends at a point $(x_2, y_2)$ located at the lower right corner. The scanning is effected by a scanning electron beam deflector 85 (shown as 85X for the X axis deflector, the Y axis deflector is not shown for simplicity) which is an electron beam deflection means of an electron beam device 8 illustrated in FIG. 5. The electron beam is completely deflected when it scans a region other than the pattern P, so that the electron beam irradiates the pattern P only. The electron beam is completely deflected by a blanking deflector (blanker) 82 which is another electron beam deflection means of the electron beam device 8 of FIG. 5. While the electron beam is performing the scanning from the point $(x_1, y_1)$ to the point $(x_2, y_2)$, the electron beam is not completely deflected, i.e., "ON" when it scans within the pattern P, and is completely deflected, i.e., "OFF" when it scans regions other than the pattern P. Data related to the positions of the electron beam or for rendering the electron beam "ON" or "OFF", have been stored in a pattern package memory which will be mentioned later. For the sake of convenience, the data related to the positions of the electron beam is hereinafter referred to as pattern package data. In FIG. 3, the "OFF" state of the pattern package data PPD is indicated by broken lines and the "ON" state is indicated by solid lines. Irradiation illustrated in the pattern P of FIG. 3 with the electron beam requires data for a coordinate position $(x_1, y_1)$ at the start-point of the surrounding figure, data for scanning the surrounding figure, and the pattern package data.

When a pattern P comprising a repetition of a chevron pattern as shown in FIG. 4 is to be irradiated with the electron beam, data for start-points of the surrounding figures for each of the patterns are necessary. Here, however, only one scanning datum and one pattern package datum will suffice for each surrounding figure.

The device of FIG. 5 operates to expose the pattern P of FIGS. 4 and 5 via the electron beam. The electron beam device 8 of FIG. 5 comprises an electron gun 81, an electron beam blanker 82, electron beam lenses 83, 84 and 86, a deflector 85X for an X axis, a deflector 85Y (not shown) for a Y axis, and a subject 9 to be exposed. A central processor unit 11 and a main memory 12 are connected, via an interface 13, to a pattern package memory 2 and a pattern generation control circuit 3. The output of the pattern generation control circuit is fed to X-axis and Y-axis digital-to-analog converters 41X and 41Y. The outputs of the digital-to-analog converters 41X and 41Y are fed to X-axis and Y-axis deflection amplifiers 42X and 42Y, and the outputs of the X-axis and Y-axis deflection amplifiers are fed to the X-axis deflector 85X and Y-axis deflector 85Y. Data read from the pattern package memory 2 is fed to a blanking drive circuit 6, and the output of the blanking drive circuit is fed to a blanker 82. The pattern generation control circuit 3 receives clock control signals from a clock control circuit 7.

The device shown in FIG. 5 operates as mentioned below. First, the pattern package data stored in the main memory 12 is read by an instruction from the central processor 11, and is written in the pattern package memory 2 passing through the interface 13. The pattern package data is time-series data for irradiating or not irradiating as shown in FIG. 3.

The data $(x_1, y_1)$ related to a contour start-point for the surrounding figure, data for electron beam scanning, data $(d_x, d_y)$ related to a distance between the start-points of the patterns, data $N_x$ related to the number of pattern trains, data $N_y$ related to the number of pattern rows, and data for specifying an address of the pattern package data, are registered in register groups 311 to 315 in the pattern generation control circuit 3. Based upon the data registered in registers 311 to 315, the pattern generation control circuit 3 sends necessary electron beam exposure signals to the digital-to-analog converters 41X and 41Y. Analog output signals from the digital-to-analog converters 41X and 41Y are fed to the deflection amplifiers 42X and 42Y, and the output signals of the deflection amplifiers 42X and 42Y are fed to the electron beam deflectors 85X and 85Y to effect the scanning by the electron beam. Only the deflector 85X for X axis is illustrated, and the deflector for Y axis is not illustrated.

The pattern package data stored in the pattern package memory 2 is read by the pattern generation control circuit 3, fed to the beam blanking driver 6, and the output signal of the beam blanking driver 6 is fed to the blanker 82 to render the electron beam on or off. Therefore, a desired pattern P is exposed on a surface of the subject 9 to be exposed because of the combination of the scanning by the deflectors 85X, 85Y and the turning on and off of the beam.

Figure 6:
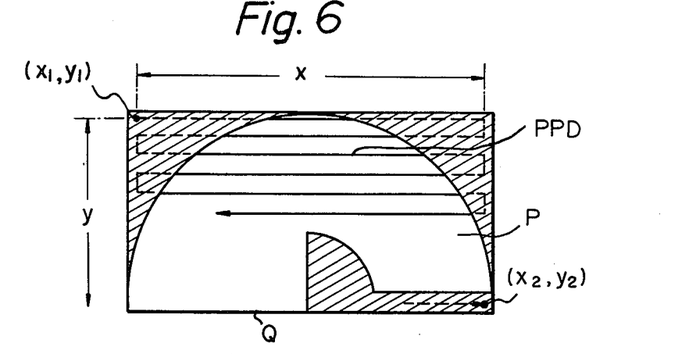
FIG. 6 is a diagram illustrating a modified example of the pattern illustrated in FIG. 3.

The pattern P need not be limited to the chevron figure as shown in FIG. 3, but may be applied to other shapes as illustrated in FIG. 6.

Figure 7:
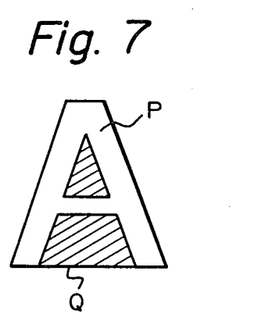
FIGS. 7, 8 and 9 are diagrams illustrating modified forms of the pattern illustrated FIG. 3.
Figure 8:
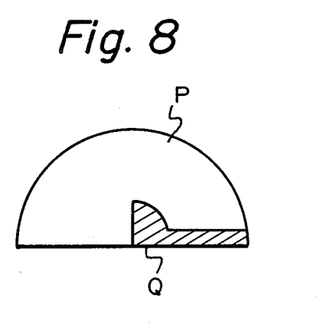
Figure 9:
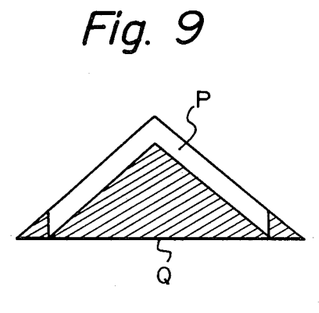

The surrounding figure Q need not be limited to the rectangular shape illustrated in FIGS. 3 and 6, but may have shapes as shown in FIGS. 7, 8 and 9. The figures of FIGS. 7, 8 and 9 circumscribe a desired pattern, and have been simplified in comparison to the desired pattern. Namely, a trapezoidal shape, a semicircular shape and a triangular shape are used as the surrounding figures.

The direction of scanning need not be limited to the horizontal direction as shown in FIG. 3, but may be tilted at a predetermined angle.

The device of FIG. 5 can further be provided with a clock control circuit 7 which feeds clock signals to the pattern generation control circuit 3, to change the scanning speed of the electron beam in order to further increase the speed of the entire exposure operation. In this case, the clock control circuit 7 changes a frequency of the clock signals; that is the clock control circuit 7 produces clock signals having an ordinary frequency when the pattern package data is "ON" and produces clock signals having an increased frequency when the pattern package data is "OFF". Therefore, when the pattern package data is "ON", the electron beam performs the scanning at a predetermined speed and the subject is irradiated in amounts sufficient for forming the pattern per unit area in a predetermined region of the specimen where the desired pattern is to be formed. When the pattern package data is "OFF", the electron beam performs the scanning at a speed greater than when the pattern package data is "ON", thus reducing the scanning time. Accordingly, the total pattern exposure operation by the electron beam can be effected at an increased speed.

In the device of FIG. 5, the digital-to-analog converter circuits 41X and 41Y perform digital-to-analog conversion of the data related to the scan start-point of the surrounding figure and digital-to-analog conversion of the scanning data. However, the same operation can also be performed by providing a digital-to-analog circuit having a relatively low speed and having an increased number of bits plus a digital-to-analog circuit having a relatively high speed and having a decreased number of bits. The digital-to-analog conversion of the data related to the start-point of surrounding figures is performed by the low speed circuit. The digital-to-analog conversion of the scanning data is performed by the high speed circuit. Then the two digital-to-analog converted outputs are added through an adder circuit, and the resulting output is fed to an amplifier for deflection.

Figure 10A:
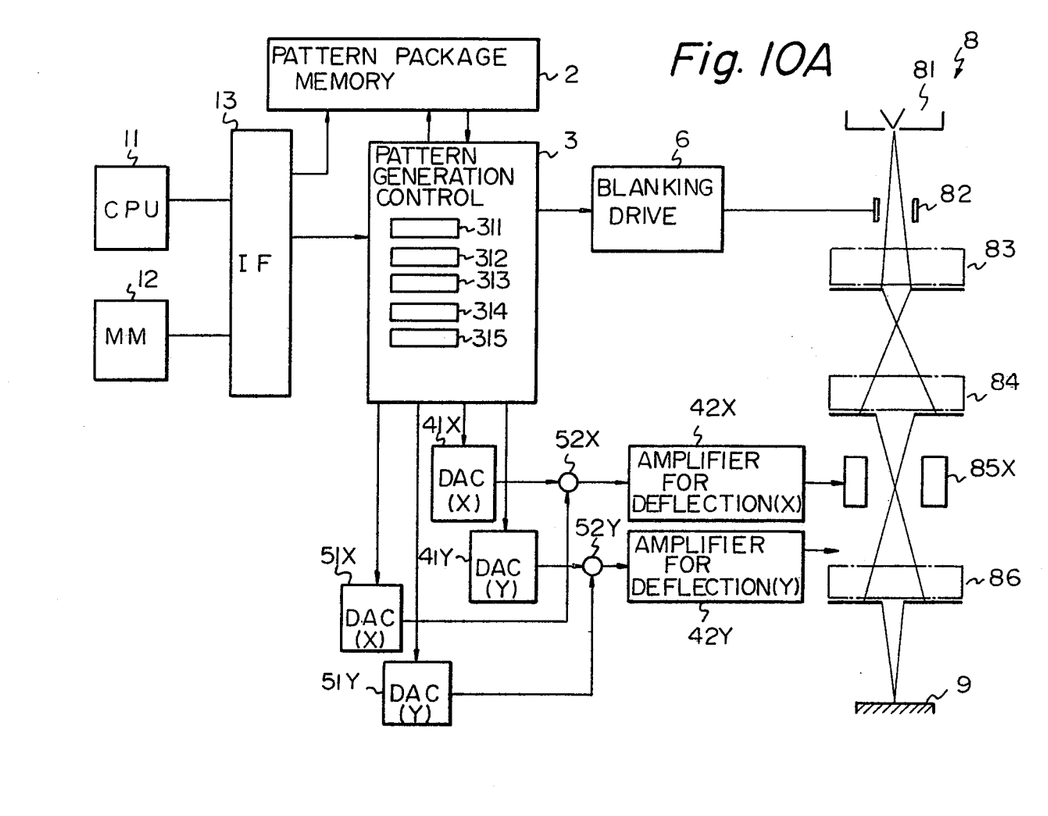
FIG. 10A is a diagram illustrating a modified example of the circuit illustrated in FIG. 5.
Figure 11:
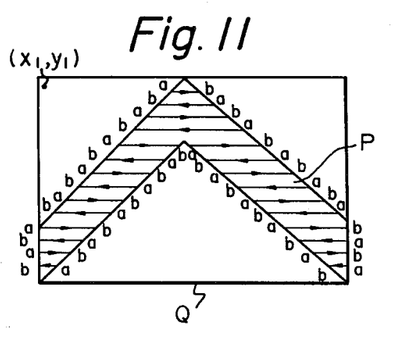
FIG. 11 is a diagram of a pattern illustrating the operation of the circuit of FIGS. 10A, 10B and 10C.

FIG. 10A illustrates a modified example of the device of FIG. 5, and FIG. 11 illustrates an exposure using an electron beam controlled by the device of FIG. 10A. According to the device of FIG. 10A, the electron beam performs the scanning only for the pattern portions P of the pattern of FIG. 11, and does not perform the scanning for portions of the figure Q other than the pattern P. The scanning is effected between the start-point a of exposure and the end point b of exposure for each scanning line. The scanning which has reached the end point b of a given scanning line moves to the start point a of the next scanning line. Therefore, the data stored in the pattern package memory 2 of the device of FIG. 10A are related to the coordinate positions of start-points and end points for each of the scanning lines. Data read from the pattern package memory 2 are fed to the blanking driver 6 via the pattern generation control circuit, and are then fed to the digital-to-analog converter circuits 41X, 41Y, 51X and 51Y. The digital-to-analog converter circuits 41X and 41Y perform the digital-to-analog conversion for the data for the contour start-point $(x_1, y_1)$, and the digital-to-analog converter circuits 51X and 51Y perform the digital-to-analog conversion for the data for the exposure start-point a and the exposure end point b. The digital-to-analog converter circuits 51X and 51Y operate at speeds faster than the digital-to-analog converter circuits 41X and 41Y. The digital-to-analog converter circuits 41X and 41Y operate at speeds lower than the digital-to-analog converter circuits 51X and 51Y, but utilize an increased number of bits to precisely determine the position of the contour start-point $(x_1, y_1)$. The outputs of the digital-to-analog converter circuits 41X and 41Y and the outputs of the digital-to-analog converter circuits 51X and 51Y are added together through adder circuits 52X and 52Y, and are fed to deflection amplifiers 42X and 42Y. The outputs of the deflection amplifiers 42X and 42Y are fed to deflectors 85X and 85Y. The pattern P of FIG. 11 is exposed to the electron beam because of the operations of the blanker 82, and deflectors 85X and 85Y.

Figure 10B:
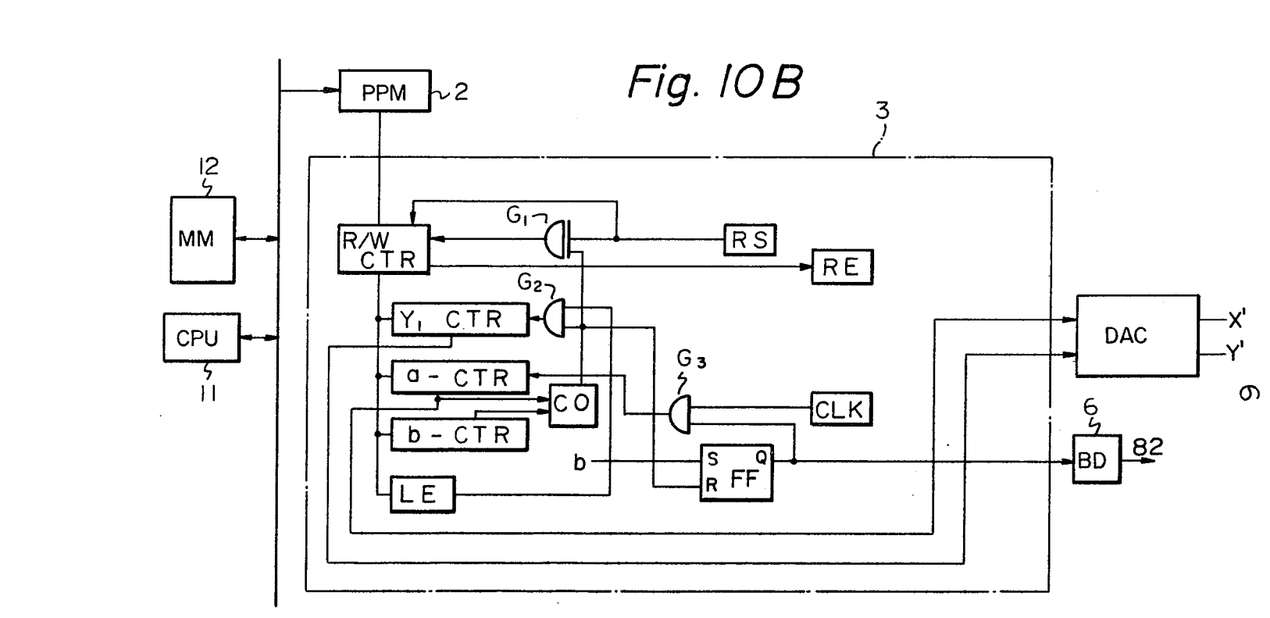
FIG. 10B is a diagram illustrating a signal processing circuit which is employed by the device illustrated in FIG. 10A.
Figure 10C:
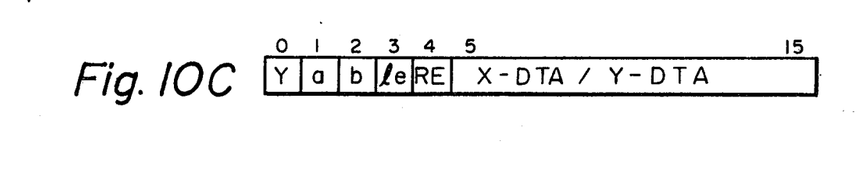
FIG. 10C is a diagram illustrating a data series for a circuit of FIG. 10B.

FIGS. 10B and 10C illustrate a signal processing circuit which is used in the pattern generation control 3 of FIG. 10A, and a scan data series used by the signal processing circuit. The beam ON/OFF data shown in FIG. 10C comprises of two bytes for one word, wherein five bits from the 0-th through the 4th bit comprise a command, and eleven bits from the 5th through the 15th bit comprise X data for horizontal deflection or Y data. The data for vertical deflection "1" in the command portion indicates that the 5–15 bits are either the a(ON) coordinate or the b(OFF) coordinate. The data "Y" bit is used to indicate a discrete change in the Y or vertical deflection. The data "le" indicates that the 5–15th bits are data for the end of the scanning line. The operation of the signal processing circuit is described below.

First the operation initiating signal RS is fed, via an OR gate $G_1$, to a read/write control circuit R/W CTR which generates an instruction for reading data. When vertical data "$Y_1$" is set in a $Y_1$ counter, a signal for setting the vertical beam scanning position to a coordinate $Y_1$ is fed to a digital-to-analog converter DAC. The digital-to-analog converter DAC produces deflection control signals X' and Y'. An X-ON(a) coordinate or horizontal deflection signal is then supplied to an ON(a) counter a-CTR and is fed to the digital-to-analog converter DAC, to set the horizontal beam position to $x_1, y_1$. Then, as an OFF(b) coordinate value is supplied to an OFF(b) counter, the flip-flop FF is set to render an AND gate $G_3$ conductive, whereby scanning clock signals CLK are fed to the ON(a) counter and to the operation of the beam blanking driver 6 is stopped. The ON(a) counter increases the counted value by one after each clock signal CLK for scanning has been received, and the counted value is supplied to the digital-to-analog converter circuit DAC to deflect the beam in the X or horizontal direction. When the counted value of the ON(a) counter comes into agreement with the value of the OFF(b) counter, a comparator circuit CO produces a pulse which is fed to a flip-flop FF to reset it; whereby the AND gate $G_3$ is rendered non-conductive and the beam blanking driver 6 is actuated. The pulse of the comparator circuit is also fed to the read/write control circuit R/W CTR, thereby generating the instruction necessary for reading the next data. The pulse is further fed to the vertical $Y_1$ counter to advance the coordinate Y by one. When the scanning has not yet reached the end of the scanning line, the output of the memory LE at the end of the scanning line produces the "LOW" level, and the AND gate $G_2$ is non-conductive; and, thus, the content of the $Y_1$ vertical counter is not increased. The above-mentioned operation is repeated thereafter to continuously scan the figure illustrated in FIG. 11.

The device shown in FIG. 10A uses pattern package data comprising of a combination of the data related to the position of start-point coordinate for each of the scanning lines and the data related to the length of the scanning line.

Figure 12A:
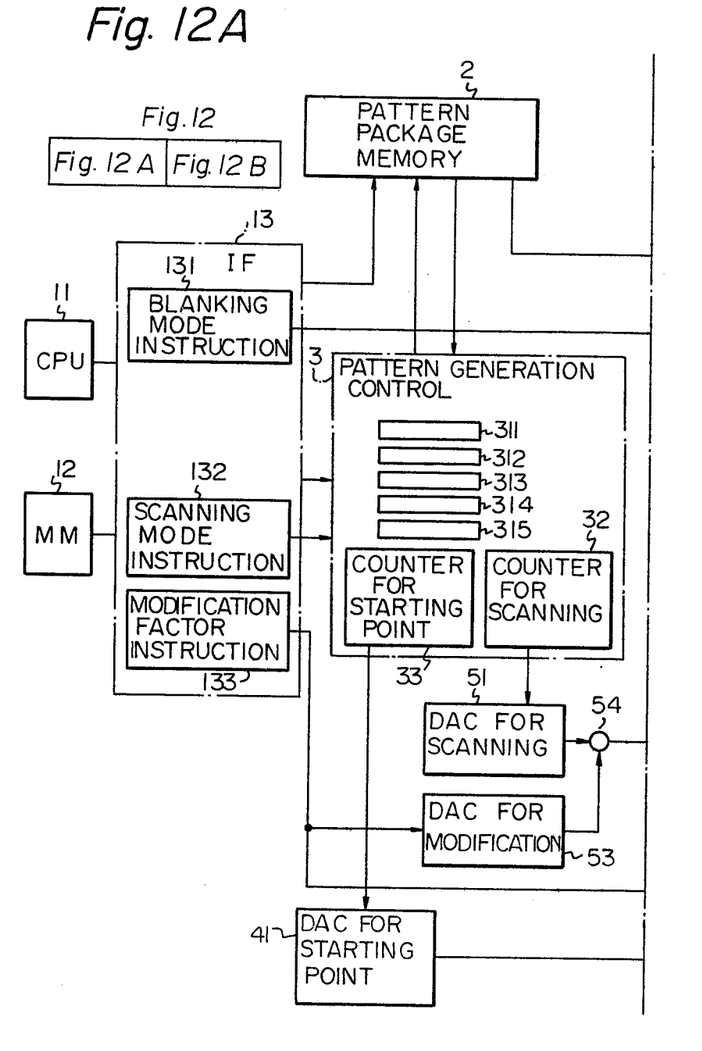
FIGS. 12A and 12B are diagrams illustrating another modified example illustrated in the circuit of FIG. 5.
Figure 12B:
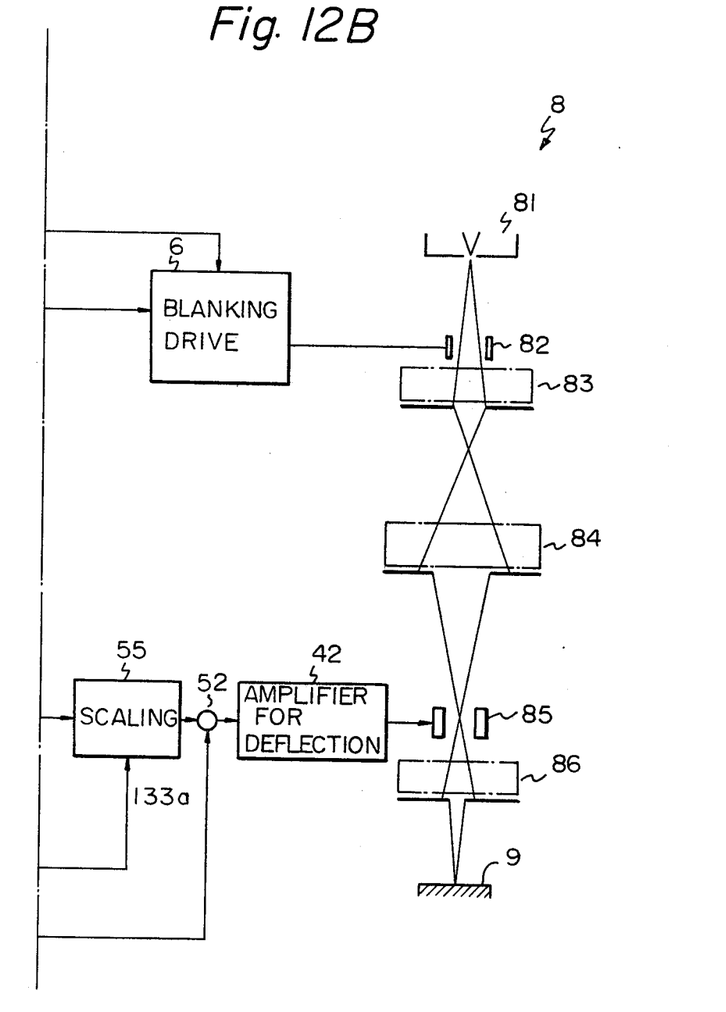

FIGS. 12A and 12B illustrate another modified example of the device of FIG. 5.

In the device illustrated in FIGS. 12A and 12B, a counter circuit 32 is controlled by a signal from a scanning mode instruction register 132 in the interface 13; and the operation of the counter circuit 32 is switched so that the X axis and Y axis of the pattern are scanned in the forward direction or in the reverse direction. Thus, the pattern being exposed can be symmetrically converted or rotated relative to the X axis and Y axis ($P_1 \rightarrow P_2$ in FIG. 13).

In the device illustrated in FIGS. 12A and 12B, furthermore, an output 133a of a modification factor instruction register 133 in the interface 13 is supplied to an enlargement reduction (scaling) circuit 55. Further, a modification factor instruction signal is fed to a digital-to-analog converter circuit 53, is used for modification factor conversion from the modification factor instruction register 133.

Figure 13:
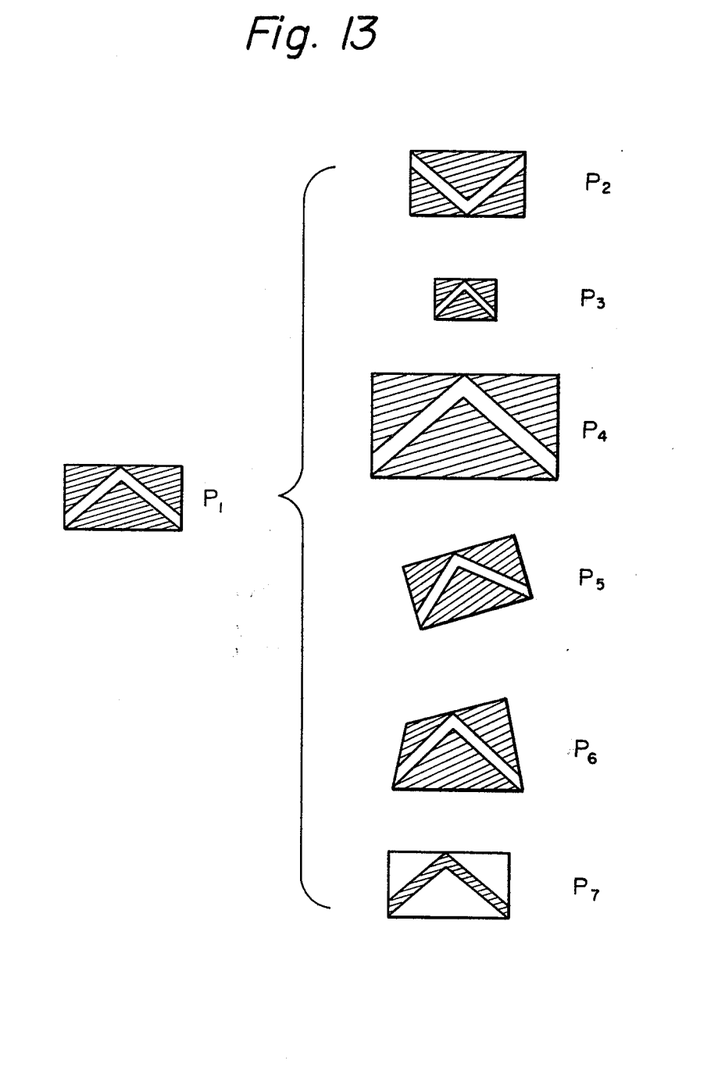
FIG. 13 is a diagram of patterns illustrating the operation of the circuit of FIG. 12.

By utilizing the signals from the modification factor instruction register 133, it is possible to obtain a contracted pattern or an enlarged pattern (See $P_1 \rightarrow P_3$, $P_1 \rightarrow P_4$ in FIG. 13), a rotated pattern (See $P_1 \rightarrow P_5$ in FIG. 13), or a pattern which is formed into a trapezoidal shape (See $P_1 \rightarrow P_6$ in FIG. 13).

In the device of FIGS. 12A and 12B, furthermore, a signal from an electron beam blanking mode instruction register 131 in the interface 13 is supplied to the electron beam blanking driver 6, to switch the blanking into a positive polarity or a negative polarity. This makes it possible to invert the black-and-white relationship of the exposed pattern (See $P_1 \rightarrow P_7$ in FIG. 13).

Figure 14:
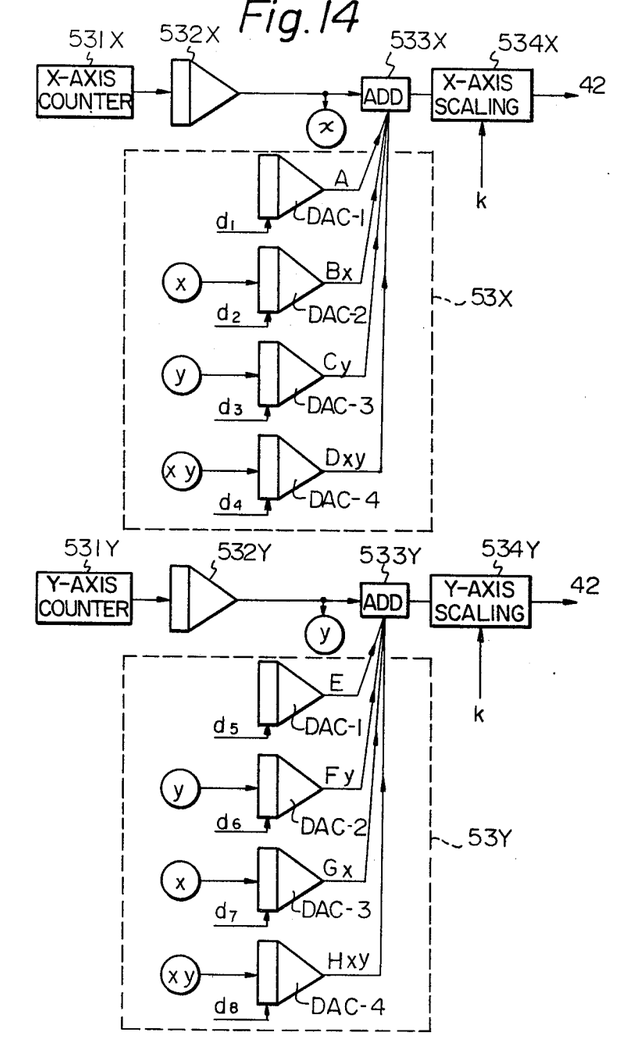
FIG. 14 illustrates a digital-to-analog converter circuit for the modification illustrated in FIG. 12.
Figure 15:
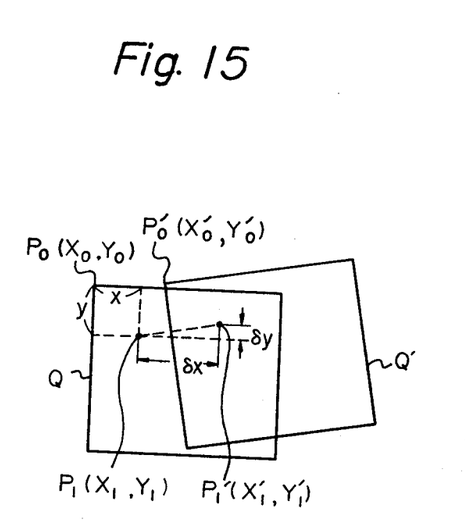
FIG. 15 a diagram illustrating patterns for the FIG. 12 modification.

FIG. 14 illustrates an example of the digital-to-analog converter circuit for modification 53, which is used in the device of FIG. 12A. FIG. 15 illustrates a fundamental pattern and a processed pattern to explain the operation of the circuit shown in FIGS. 12A and 12B. Q denotes a rectangular region formed by packaging the fundamental pattern, and Q' denotes a rectangular region which packages a processed pattern which is to be formed as a pattern. Symbols $P_0$ and $P_0'$ denote origins in the rectangular regions Q and Q', respectively and $P_1$ and $P_1'$ denote corresponding points in the rectangular regions Q and respectively Q'. Coordinates $(X_0, Y_0)$, $(X_0', Y_0')$, $(X_1, Y_1)$ and $(X_1', Y_1')$ are those for the points $P_0$, $P_0'$, $P_1$ and $P_1'$, respectively. Symbols x and y denote quantities of displacement from the point $P_0$ to the point $P_1$ in the X and Y directions, and $\delta_x$ and $\delta_y$ denote quantities of modification that will be applied to the data x, y to shift the point of electron beam from the point $P_1$ to the point $P_1'$. The modification quantities $\delta_x$ and $\delta_y$ can be given by the following equalities:

$$\delta_x = A + Bx + Cy + Dxy$$

$$\delta_y = E + Fy + Gx + Hxy$$

where A and E denote quantities of parallel translation (shifting quantities) in the X and Y directions, C and G denote modification factors for the displacement quantities y and x for attaining the rotational motion, B and F denote an enlarging or a contracting factor for modifying errors associated with the rotation, and D and H denote modification factors for the displacement quantities x and y for attaining a trapezoidal modification.

Responsive to an instruction from the central processor unit 11, the modification factor signal is fed from the modification factor instruction register 133 to the digital-to-analog converter circuit 53 for modification, and is added to the output of the digital-to-analog converter circuit 51 for scanning through the adder circuit 54.

Referring to FIG. 14, the digital-to-analog converter circuit for modification comprises of a digital-to-analog converter circuit DAC-1 for parallel translation, a digital-to-analog converter circuit DAC-2 for modifying rotational errors, a digital-to-analog converter circuit DAC-3 for rotation, a digital-to-analog converter circuit DAC-4 for trapezoidal deformation, a counter circuit 531X for the X axis, a digital-to-analog converter circuit 532X for scanning the X axis, an adder circuit 533X for the X axis, a scaling circuit 534X for the X axis, a counter circuit 531Y for the Y axis, a digital-to-analog converter circuit 532Y for scanning the Y axis, an adder circuit 533Y for the Y axis, and a scaling circuit 534Y for the Y axis. A signal for indicating the scaling factor is denoted by k. Digital signals $d_1$ and $d_5$ for indicating the shifting quantities for parallel translation, digital signals $d_3$ and $d_7$ indicating the modification factors for rotation, digital signals $d_2$ and $d_6$ for indicating the modification factors for rotational errors, and digital signals $d_4$ and $d_8$ for instructing the modification factors for trapezoidal deformation, are supplied to the digital-to-analog converter circuits DAC-1, DAC-2, DAC-3 and DAC-4, respectively.

We claim:

1. An exposure method for forming a pattern using an electron beam, a pattern package memory, a pattern generation control device, electron beam deflection means, an electron beam irradiation device and a central processor, comprising:

(a) forming a simplified surrounding figure surrounding a fundamental pattern to be exposed;

(b) storing first data for positions of the electron beam in the pattern package memory representing said fundamental pattern based upon said surrounding figure;

(c) storing second data related to contour start-points of the surrounding figure and scanning data for scanning the entire figure in a pattern generation control device;

(d) supplying the second data related to the contour start-points of the surrounding figure and the scanning data from said pattern generation control device to the electron beam deflection means of the electron beam irradiation device; and (e) supplying the first data related to the positions of the electron beam from said pattern package memory to the electron beam deflection means of the electron beam irradiation device in response to instructions from the central processor, so that the pattern is formed by said electron beam irradiation device.

2. An exposure method using an electron beam according to claim 1, wherein the electron beam deflection means includes a blanker, wherein step b comprises storing ON and OFF data for the electron beam for forming the pattern in the pattern package memory as the first data related to the positions of the electron beam, and wherein step e comprises supplying said ON and OFF data to the blanker of the electron beam deflection means.

3. An exposure method using an electron beam according to claim 2, wherein further included is a clock control circuit for supplying clock signals to said pattern generation control device which receives said ON and OFF data for the electron beam, and wherein step e further comprises producing clock signals of a first frequency when the ON and OFF data of the electron beam indicates "ON", and producing clock signals of a second frequency when said ON and OFF data indicate "OFF," so that the electron beam performs scanning at different speeds.

4. An exposure method using an electron beam according to claim 1, 2 or 3,
wherein the fundamental pattern has a mode,
wherein further included are a drive circuit and conversion signal generator means for converting the mode, and
wherein step e further comprises controlling input signals of the drive circuit in the electron beam deflection means in the electron beam irradiation device by using the conversion signal generator means which converts the mode of the fundamental pattern.

5. An exposure method using an electron beam according to claim 2 or 3,
wherein the fundamental pattern has a mode,
wherein further included are a drive circuit and conversion signal generator means, and
wherein step e further comprises controlling input signals of a drive circuit of the blanker in the electron beam irradiation device by using the conversion signal generator means which converts the mode of the fundamental pattern.

6. An exposure method using an electron beam according to claim 1,
wherein further included are a first digital-to-analog converter, a second digital-to-analog converter, an adder, a deflection amplifier and deflecting electrode, and
wherein step e further comprises:
supplying a first output signal from said pattern generation control device to the first digital-to-analog converter for converting the second data related to contour start-points of the surrounding figure;
supplying a second output signal from said pattern generation control device to the second digital-to-analog converter for converting the scanning data;
adding an output signal from said first digital-to-analog converter for the data related to the contour start-points of the surrounding figure and an output signal from said second digital-to-analog converter for the scanning data together;
supplying the added result to the deflection amplifier; and
supplying an output sigal from said deflection amplifier to the deflecting electrode of the electron beam irradiation device.

7. An exposure method using an electron beam according to claim 6, wherein step b further comprises storing at least coordinate data comprising coordinates of a start-point and a stop-point for each of scanning lines in the surrounding figure in the pattern package memory as the first data related to positions of the electron beam, and the electron beam is caused to scan only in the pattern which is to be formed on the basis of the coordinate data for the coordinates for the start-point and the stop-point.

8. An exposure method according to claim 1, wherein said first data corresponds to scan pattern data for the positive image of the fundamental pattern and the simplified surrounding figure.

9. An exposure method for a subject using an electron beam, a pattern package memory, a pattern generation control device, a digital-to-analog converter, a deflection amplifier, a blanking device, a scaling circuit, a modification factor signal and a polarity signal, comprising:
surrounding a fundamental pattern by a figure having a contour start point;
storing in the pattern package memory fundamental data comprising coordinates of a start-point and a stop-point of a scan pattern used in forming the fundamental pattern using said electron beam and the contour start-point of said figure;
storing in the pattern generation control device scanning repetition data comprising data indicating horizontal and vertical distances between contour start-points of a plurality of fundamental patterns to be formed on the subject, data for electron beam scanning the figure, a number representing how many fundamental patterns are to be formed on the subject, and data specifying an address for the fundamental data in said pattern package memory;
combining the fundamental data stored in the pattern package memory, the scanning data and the repetition data stored in the pattern generation control device to generate combined output signals from the pattern generation control device;
applying the combined output signals to the digital-to-analog converter and generating an analog output;
applying the analog output to the deflection amplifier and controlling the deflection of said electron beam;
starting and stopping the electron beam by applying the fundamental data to the blanking device;
controlling the analog output applied to said deflection amplifier to symmetrically convert said fundamental pattern in dependence upon the modification factor signal;
controlling the blanking device to invert the polarity of said fundamental pattern in dependence upon the polarity signal; and
controlling the analog output applied to the deflection amplifier to alter the size of said pattern and the shape of said figure in dependence upon the modification factor signal by using the scaling circuit, so that it is possible to alter the size of said pattern, rotate said pattern and alter the shape of said figure.

10. An exposure system for forming a fundamental pattern on a subject using an electron beam, comprising:
pattern package memory for pre-storing and outputting fundamental pattern data corresponding to the scan pattern for the fundamental pattern surrounded by a simplified figure;
a pattern generation control circuit, operatively connected to said pattern package memory, for storing pattern repetition data and simplified figure data and for generating electron beam control data in dependence upon the fundamental pattern data, the pattern repetition data and the simplified figure data, the simplified figure data being for scanning the entire simplified figure;
a clock control circuit, operatively connected to said pattern package memory and said pattern generation control circuit, for controlling a rate of the generation of the electron beam control data in dependence on the fundamental pattern data;
a blanking driver, operatively connected to said pattern generation control circuit and said pattern package memory, for generating a blanking signal in dependence upon the repetition data and the fundamental pattern data;
blanking deflector means, operatively connected to said blanking driver, for deflecting the electron beam in dependence upon the blanking signal;

a first digital-to-analog converter, operatively connected to said pattern generation control circuit, for converting the electron beam control data into an analog deflection signal; and beam deflection means, operatively connected to said first digital-to-analog converter, for deflecting the electron beam in dependence upon the analog deflection signal, so that the pattern is formed on the subject.

11. An exposure system for forming a pattern on a subject using an electron beam according to claim 10, wherein said system is operatively connectable to receive modification data, wherein said system further comprises:

a second digital-to-analog converter, operatively connectable to receive the modification data, for converting the modification data into an analog modification signal;

an adder, operatively connected to said first and second digital-to-analog converters, for generating a sum signal in dependence upon the analog deflection signal and the analog modification signal; and a scaling circuit, operatively connected to said adder, and said beam deflector means and operatively connectable to receive the modification data, for generating a scaled signal in dependence upon the sum signal and the modification data, so that the pattern formed on the subject can be modified and scaled.

12. An exposure system according to claim 10, wherein said fundamental pattern data corresponds to scan pattern data for the positive image of the fundamental pattern and the simplified figure.

13. An exposure system using an electron beam, comprising:

electron beam blanking means for blanking the electron beam;

scanning electron beam deflector means for deflecting the electron beam;

a pattern generation control circuit operatively connected to said scanning electron beam deflector means; and a pattern package memory operatively connected to said electron beam blanking means;

said pattern generation control circuit storing scan data on the location and size of a simple surrounding figure which surrounds a pattern to be irradiated by the electron beam, said pattern package memory storing blanking data for providing instructions for when the beam is to be blanked while being scanned over the surrounding figure to generate the pattern to be irradiated, a signal for scanning the entire area of the surrounding figure based on the location and size data being supplied to the scanning electron beam deflector means from the pattern generation control circuit, and a signal for blanking the electron beam being supplied to the electron beam blanking means from the pattern package memory.

14. An exposure system according to claim 13, further comprising a clock control circuit, operatively connected to said pattern package memory and said pattern generation control circuit, for supplying clock signals to said pattern generation control circuit and for receiving the signal for blanking the electron beam, said clock control circuit producing clock signals of one frequency when the electron beam is irradiating the pattern and producing clock signals of another, higher frequency when the electron beam is blanked, so that the electron beam moves more rapidly over the parts of the surrounding figure that are not to be irradiated.

15. An exposure system according to claim 14 wherein start-point data for coordinates of a start-point of each of scanning lines in the surrounding figure are stored in said pattern package memory as data related to positions for irradiating the electron beam, and the electron beam is caused to scan only in the pattern which is to be formed on the basis of the start-point for coordinates of the start-points, the blanking data and the scan data.

* * * * *

UNITED STATES PATENT AND TRADEMARK OFFICE
CERTIFICATE OF CORRECTION

PATENT NO. : 4,484,077
DATED : NOVEMBER 20, 1984
INVENTOR(S) : SEIGO IGAKI ET AL.

It is certified that error appears in the above-identified patent and that said Letters Patent is hereby corrected as shown below:

FRONT PAGE, [57] ABSTRACT, line 5, after "horizontal" insert --positions of the--.

Col. 1, line 21, "irradiating" should be --generating--;
      line 24, delete "irradiation";
      line 31, "instruction" should be --instructions--;
      line 41, "," should be --;--;
      line 51, "a" should be --$\underline{a}$--; and "b" should be --$\underline{b}$--;
      line 55, after "and" insert --this--.

Col. 5, line 33, "b" should be --$\underline{b}$--;
      line 35, "b" should be --$\underline{b}$--;
      line 36, "a" should be --$\underline{a}$--;
      line 48, "a" should be --$\underline{a}$--;
      line 49, "b" should be --$\underline{b}$--.

Col. 6, line 8, "a(ON)" should be --$\underline{a}$(ON)--; and "b(OFF)" should be --$\underline{b}$(OFF)--;
      line 10, ""le"" should be --"$\overline{\ell e}$"--;
      line 21, "X-ON(a)" should be --X-ON($\underline{a}$)--;

UNITED STATES PATENT AND TRADEMARK OFFICE
CERTIFICATE OF CORRECTION

PATENT NO. : 4,484,077

DATED : NOVEMBER 20, 1984

INVENTOR(S) : SEIGO IGAKI ET AL.

It is certified that error appears in the above-identified patent and that said Letters Patent is hereby corrected as shown below:

Col. 6, line 24, "ON(a)" should be --ON($\underline{a}$)--; and "a-CTR" should be --$\underline{a}$-C$\overline{T}$R--;
line 26, "OFF(b)" should be --OFF($\underline{b}$)--;
line 27, "OFF(b)" should be --OFF($\underline{b}$)--;
line 29, "ON(a)" should be --ON($\underline{a}$)--;
line 31, "ON(a)" should be --ON($\overline{a}$)--;
line 36, "ON(a)" should be --ON($\overline{a}$)--;
line 37, "OFF(b)" should be --OF$\overline{F}$($\underline{b}$)--.

Col. 7, line 33, "Q and respectively Q'" should be --Q and Q', respectively--.

Signed and Sealed this

Tenth Day of September 1985

[SEAL]

Attest:

DONALD J. QUIGG

Attesting Officer   Acting Commissioner of Patents and Trademarks - Designate